United States Patent
Takemoto et al.

(10) Patent No.: US 6,628,127 B2
(45) Date of Patent: Sep. 30, 2003

(54) PROBE CARD FOR TESTING SEMICONDUCTOR INTEGRATED CIRCUIT AND METHOD OF MANUFACTURING THE SAME

(75) Inventors: Megumi Takemoto, Tokyo (JP);
Shigeki Maekawa, Tokyo (JP);
Yoshihiro Kashiba, Tokyo (JP);
Yoshinori Deguchi, Tokyo (JP);
Masahiro Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 151 days.

(21) Appl. No.: 09/748,279

(22) Filed: Dec. 27, 2000

(65) Prior Publication Data

US 2001/0015650 A1 Aug. 23, 2001

(51) Int. Cl.$^7$ ................................................ G01R 1/073
(52) U.S. Cl. ........................................ 324/754; 324/765
(58) Field of Search ................................ 324/754, 757, 324/758, 761, 765

(56) References Cited

U.S. PATENT DOCUMENTS 5,326,428 A * 7/1994 Farnworth et al. .......... 324/724
5,559,444 A * 9/1996 Farnworth et al. .......... 324/754

FOREIGN PATENT DOCUMENTS

| JP | 10-90307 | 4/1998 |
| JP | 10-111315 | 4/1998 |
| JP | 2000-88887 | 3/2000 |

* cited by examiner

*Primary Examiner*—Ernest Karlsen
(74) *Attorney, Agent, or Firm*—Burns, Doane, Swecker & Mathis, LLP

(57) ABSTRACT

A probe card 8 for testing a semiconductor integrated circuit is provided with a plurality of probes for inputting/outputting an electric signal for verifying the operation of a semiconductor integrated circuit 6 to/from bonding pads 7 of the semiconductor integrated circuit. The probes 9 are formed by depositing a conductive film 11 on a surface of a plurality of convex portions formed on a surface of an insulating substrate 10.

12 Claims, 15 Drawing Sheets

SCRUBBING DIRECTION

SCRUBBING DIRECTION

PROBE CARD FOR TESTING SEMICONDUCTOR INTEGRATED CIRCUIT AND METHOD OF MANUFACTURING THE SAME

BACKGROUND OF THE INVENTION

1. Field of the Invention

The present invention relates to a probe card for testing a semiconductor integrated circuit and a method of manufacturing the same, and more particularly to a technique permitting a probe to be easily formed and testing to be made at great reliability.

2. Description of the Related Art

Traditionally, a probe card for testing a semiconductor integrated circuit is formed in a structure in which as shown in FIG. 18, a through-hole 2 is formed to penetrate an insulating substrate 1 made of e.g. polyimide or glass so that the through-hole 2 electrically connects one surface to the other surface. The through-hole 2 is plated to form a wiring 3 connect the one surface of the substrate 1 to the other surface thereof.

On the one surface, a probe for contact with the semiconductor integrated circuit is made as a metallic bump 4 of nickel and such like by e.g. plating. At a position on the wiring 3 on the other surface which is opposite to the position where the metallic bump 4 is formed, an electrode 5 for inputting/outputting an electric signal is formed by a solder bump or anisotropic conductive rubber. The probe card for testing a semiconductor integrated circuit has been improved in various forms, and the related arts are disclosed in JP-A-10-90307 and JP-A-10-111315.

In the case that the substrate 1 is made of a polyimide film, a conventional probe card for testing a semiconductor integrated circuit is defective in that it generates misalignment in high temperature testing because of a large difference in the linear expansion coefficient between the polyimide film and the semiconductor integrated circuit, thereby deteriorating the reliability of the testing. The conventional probe card is also defective in that in order to form the metallic bump 4 having a certain height as a probe, plural times of plating must be carried out because a sufficient height cannot be made when plating is made only once, thereby increasing the number of steps in the manufacturing process and complicating the process.

Since each metallic bump 4 and each electrode 5 are formed at opposite positions with respect to the substrate, when there is a difference in the height between the metallic bumps 4 and the electrodes 5, the metallic bumps 4 are not brought into contact with the semiconductor integrated circuit at some positions. This deteriorates the reliability of testing.

The present invention has been accomplished in order to solve the problems described above, and intends to provide a probe card for testing a semiconductor integrated circuit which can be easily manufactured and can test the semiconductor integrated circuit with great reliability, and a method of manufacturing such a probe card.

SUMMARY OF THE INVENTION

According to first aspect of the invention, A probe card for testing a semiconductor integrated circuit, having a plurality of probes adapted to input/output an electric signal for verifying an operation of the semiconductor integrated circuit to/from a plurality of positions on the semiconductor integrated circuit, the probe card comprises an insulating substrate defining a plurality of convex portions on a surface thereof, and conductive film depositing on the surface of the convex portions of the insulating substrate to form the plurality of probes.

Second aspect of the invention proposes a probe card for testing a semiconductor integrated circuit according to the first aspect of the invention, wherein an uppermost layer of the conductive film is made of tungsten film.

According to third aspect of the invention a probe card for testing a semiconductor integrated circuit, having a plurality of probes adapted to input/output an electric signal for verifying an operation of the semiconductor integrated circuit to/from a plurality of positions on the semiconductor integrated circuit, the probe card comprises:

- an insulating substrate defining a plurality of concave portions; and
- a plurality of the conductive members embedded in the concave portions to protrude upper ends of the conductive members from an upper surface of the insulating substrate, thereby to form the plurality of the probes.

According to fourth aspect of the invention, a probe card for testing a semiconductor integrated circuit, having a plurality of probes adapted to input/output an electric signal to/from a plurality of positions of the semiconductor integrated circuit for verifying an operation of the semiconductor integrated circuit, the probe card comprises:

- an insulating substrate defining a plurality of through-holes; and
- a plurality of conductive members embedded in the plurality of through-holes,
- wherein one end of the conducive members contacting with the semiconductor integrated circuit is protruded from an upper surface of the insulating substrate.

Fifth aspect of the invention proposes a probe card for testing a semiconductor integrated circuit according to the fourth aspect of the invention, further comprising an electrode adapted to input/output an electric signal, the electrode formed on a surface different from a side of the plurality of probes formed.

Sixth aspect of the invention proposes a probe card for testing a semiconductor integrated circuit according to any one of the first to fifth aspects of the invention, wherein the probes are formed to have a surface coarseness of 0.3 $\mu$m or less.

Seventh aspect of the invention proposes a probe card for testing a semiconductor integrated circuit according to any one of the first to fifth aspects of the invention, wherein the probes are formed to have an angle in a range of 15 to 35 degree between a contacted surface of the semiconductor integrated circuit and a surface of the probes when the probes are brought into contact with the semiconductor integrated circuit.

According to eighth aspect of the invention, a probe card for testing a semiconductor integrated circuit comprises:

- an insulating substrate;
- a plurality of probes adapted to input/output an electric signal for verifying an operation of the semiconductor integrated circuit to/from a plurality of positions of the semiconductor integrated circuit, the probes formed on one surface of the insulating substrate;
- through-holes formed to pass through the insulating substrate at positions which are different from positions of the probes so as to electrically connect the probes to side of the other surface of the insulating substrate which is different from one surface formed the probes, respectively;

electrodes each formed on each of the through-holes, adapted to input/output the electric signal, wherein each of relationships of relative positions between each of the probes and each of the through-holes connected to each of the probes are the same.

According to a ninth aspect of the invention, a probe card for testing a semiconductor integrated circuit comprises:

an insulating substrate;

a plurality of probes adapted to input/output an electric signal for verifying an operation of the semiconductor integrated circuit to/from a plurality of positions of the semiconductor integrated circuit, the plurality of probes formed on one surface of the insulating substrate; and through-holes formed to pass through the insulating substrate so as to electrically connect the probes to side of the other surface of the insulating substrate with each other, which is different from one surface formed the probes, respectively, each of the through-holes having sectional shape in an approximately U-shaped, wherein each of concave sides of the sectional shape of the through-holes face to positions of the probes According to tenth aspect of the invention, A probe card for testing a semiconductor integrated circuit comprises:

an insulating substrate;

a plurality of probes adapted to input/output an electric signal for verifying an operation of the semiconductor integrated circuit to/from a plurality of positions of the semiconductor integrated circuit, the probes formed on one of surfaces of the insulating substrate;

through-holes formed to pass through the insulating substrate at positions which is different from positions of the probes so as to electrically connect probes to side of the other surface of the insulating substrate which is different from one surface formed the probes, respectively; and wirings formed on one surface of the insulating substrate where the probes are formed, to connect the probes to the through-holes with each other, respectively, wherein all longitudinal directions of the wirings are formed perpendicular to a direction of scrubbing the probe card.

Eleventh aspect of the invention proposes a probe card for testing a semiconductor integrated circuit according to any one of the first to tenth aspects of the invention, wherein the substrate is a glass substrate.

According to twelfth aspect of the invention, a method of manufacturing the probe card for testing a semiconductor integrated circuit according to the eleventh aspect of the invention, the method comprises the steps of increasing temperature to transition temperature of the glass substrate, and press molding the glass substrate by a mold.

According to thirteenth aspect of the invention, a method of manufacturing a probe card for testing a semiconductor integrated circuit according to the twelfth aspect of the invention, further comprises the step of pressing a pressing tool having a higher hardness than that of the mold onto the mold to form a plurality of desired concave portions.

According to fourteenth aspect of the invention, a method of manufacturing a probe card for testing a semiconductor integrated circuit according to claim 13, further comprises the steps of filling the concave portions of the mold with the glass substrate to form convex portions on the glass substrate, and forming conductive film on the convex portions of the glass substrate by CVD technique or PVD technique to form the probes.

According to fifteenth aspect of the invention, a method of manufacturing a probe card for testing a semiconductor integrated circuit according to the twelfth or thirteenth aspect of the invention, further comprises the steps of:

forming a mold having a plurality of concave portions;

arranging conductive members in concave portions, respectively;

press molding the glass substrate by the mold to embed part of the conductive members in the glass substrate and to protrude the part of the conductive members from the glass substrate so as to form the probes.

According to sixteenth aspect of the invention, a method of manufacturing a probe card for testing a semiconductor integrated circuit according to any one of the twelfth to fifteenth aspect of the invention, further comprises the steps of polishing a surface of the glass substrate which is different from a surface thereof where the probes are formed, to decrease the thickness of the glass substrate into a prescribed thickness, and forming through-holes at desired positions of the glass substrate.

According to seventeenth aspect of the invention, a method of manufacturing a probe card for testing a semiconductor integrated circuit according to the fifteenth aspect of the invention, further comprises a step of pressing the glass substrate until each of the conductive members penetrates the glass substrate.

According to eighteenth aspect of the invention, a method of manufacturing a probe card for testing a semiconductor integrated circuit according to the seventeenth aspect of the invention, further comprises the steps of polishing one end of each of the conductive members so that lengths of the conducive members protruding from the glass substrate are uniform, to form the plurality of probes, and polishing the glass substrate and the conductive members so that the other end of each of the conductive members is flush with a surface of the glass substrate.

According to nineteenth aspect of the invention, a method of manufacturing a probe card for testing a semiconductor integrated circuit according to any one of the sixteenth to eighteenth aspect of the invention, the step of rounding a surface of one end of each the conductive member protruding from the glass substrate by polishing or wet etching to form the probes to form the surfaces of the probes according to the seventh aspect of the invention.

DETAILED DESCRIPTION OF THE EMBODIMENTS

Embodiment 1

Figure 1:
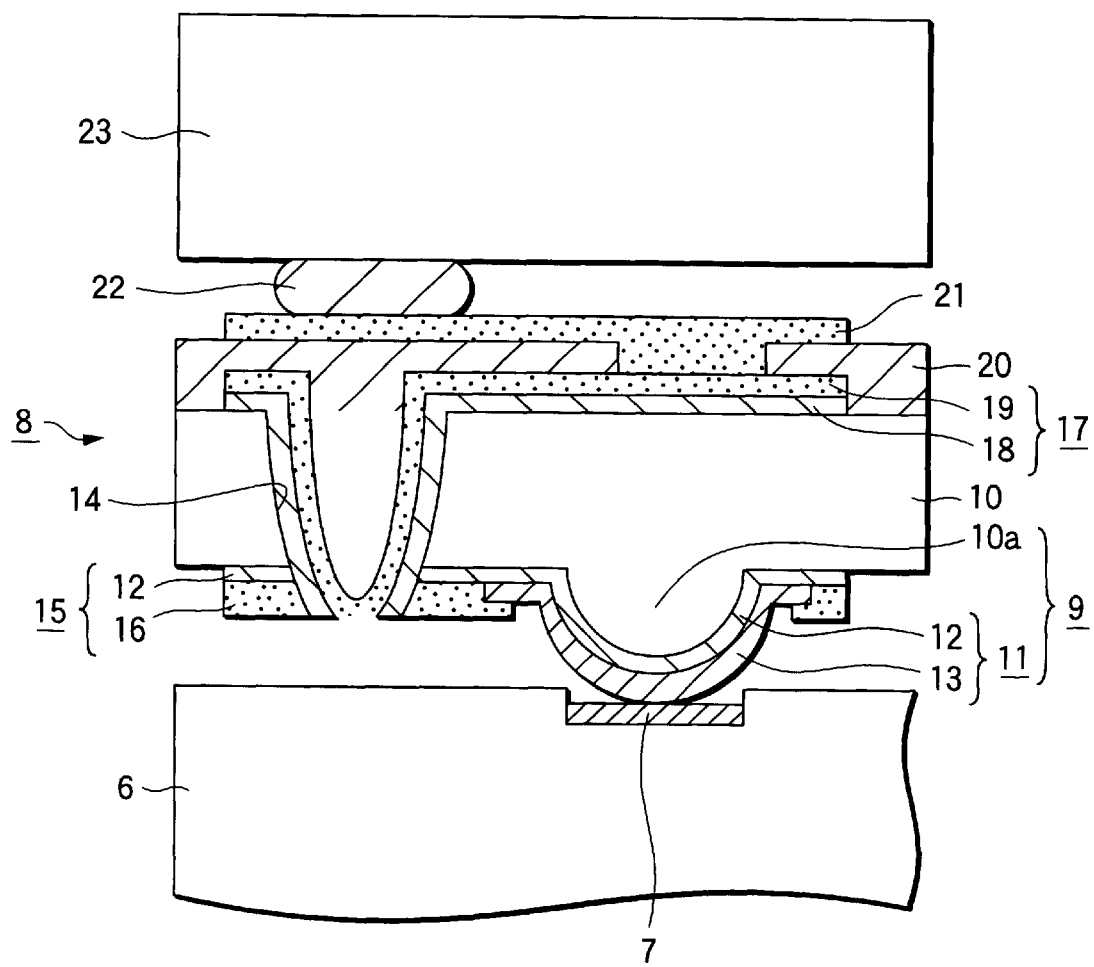
FIG. 1 is a sectional view of the probe card for testing a semiconductor integrated circuit according to the first embodiment of the invention.

An explanation will be given of embodiments of the invention. FIG. 1 is a sectional view showing a structure of a probe card for testing a semiconductor integrated circuit according to the first embodiment of the invention. In FIG. 1, reference numeral 6 denotes semiconductor integrated circuit, and reference numeral 7 denotes bonding pads formed at a plurality of positions on a semiconductor integrated circuit 6. The bonding pad 7 serves to input/output an electric signal from/to the outside. The bonding pad 7 is made of e.g. aluminum, aluminum alloy, or such like and has about 1 μm in thickness.

Reference numeral 8 denotes a probe card for testing the semiconductor integrated circuit, having a plurality of probes 9 (for simplicity of illustration, in FIG. 1, only one probe 9 and only one bonding pad 7 are shown) for inputting/outputting an electric signal to/from the bonding pads 7 disposed at the plurality of positions on the semiconductor integrated circuit 6 to verify an operation of the semiconductor integrated circuit 6. The probe card 8 is structured as follows. Reference numeral 10 denotes an insulating substrate defining a plurality of convex portions 10a on its surface and having a thickness of e.g. 10–50 μm. The plurality of convex portions 10a are formed at intervals of about 100–140 μm.

Reference numeral 11 denotes a conductive film deposited on a surface of the convex portion 10a. The conductive film 11 comprises a contact film 12 made of e.g. a chrome film to be in contact with the substrate 10 and a tungsten film 13 formed on the contact film 12 and constituting an uppermost layer of the conductive film 11. The probe 9 includes the convex portion 10a and the conductive film 11. The probe 9 is formed to protrude from the flat surface of the substrate 10 by 30–50 μm. Reference numeral 14 denotes a through-hole formed to penetrate through the substrate 10 at a different position from the position of each probe 9. The through-hole 14 serves to electrically connect the probe 9 to the side of the substrate 10 opposite to the side where the probe 9 is formed.

Reference numeral 15 denotes a wiring formed on the surface of the substrate 10 where the probe 9 is formed in order to connect the probe 9 to the through-hole 14. The wiring 15 comprises the contact film 12, and a metallic film 16 formed on the contact film 12 and formed of copper film or nickel film having small electric resistance. Reference numeral 17 denotes an underlying wiring formed on an inner wall of the through-hole 14 and the surface of the substrate 10 opposite to the surface thereof where the probe 9 is formed. The underlying wiring 17 comprises a contact film 18 made of e.g. chrome to be in contact with substrate 10, and a metallic film 19 formed on the contact film 18 and formed of copper film or nickel film having small electric resistance.

Reference numeral 20 denotes an insulating film patterned to cover the underlying wiring 17 and formed of e.g. a polyimide film. Reference numeral 21 denotes an overlying wiring formed on the insulating film 20 to electrically connect to the underlying wiring 17. The overlying wiring 17 is formed of copper film or nickel film having small in electric resistance. Reference numeral 22 denotes an electrode formed on the overlying wiring at a position where the through-hole 14 is formed. For example, the electrode 22 is formed of a solder ball. Reference numeral 23 is a wiring board for inputting/outputting an electric signal to/from the electrode 22.

An explanation will be given of a method of manufacturing a probe card according to the first embodiment structured as described above. First, the case where a glass substrate is used as the substrate will be explained. The glass substrate can be formed into a desired shape using a mold. In this case, the mold is used which is made of a material having a slightly smaller linear expansion coefficient than that of the glass substrate, e.g. an alloy of tungsten and molybdenum or a Ferrite-system SUS. This intends to easily release the glass substrate from the mold after the glass substrate is pressed molding using the mold.

Figure 2:
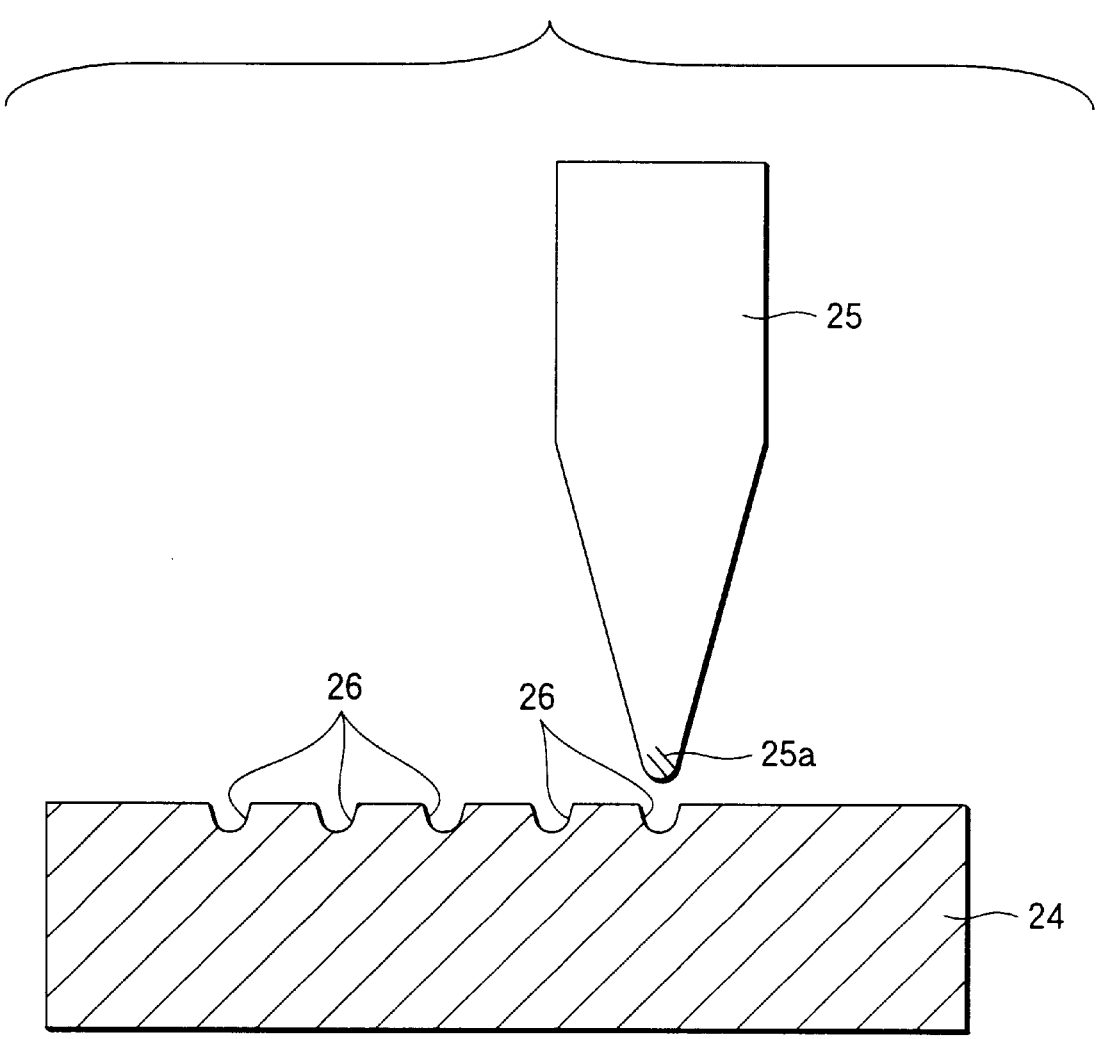
FIG. 2 is a view showing the method of manufacturing the probe card as shown in FIG. 1.

As shown in FIG. 2, a pressing tool 25 having a tip 25a made of a material with higher hardness than that of the mold 24, is pressed onto the mold 24 to leave pressing trace and a plurality of concave portions 26 is formed. The tip 25a may be made of a hard material such as diamond, ruby, sapphire, ultra-steel, etc. By means of this method, the plurality of concave portions 26 can be formed within an error span of ±0.3 μm in a depth direction.

Figure 3:
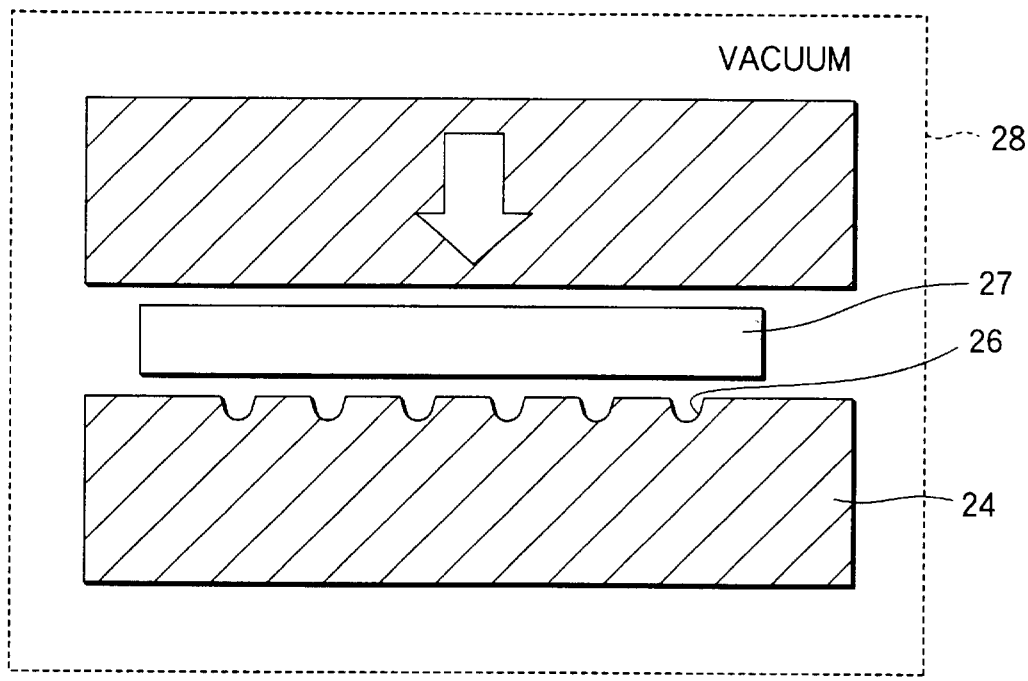
FIG. 3 is a view showing the method of manufacturing the probe card as shown in FIG. 1.

Further, if the tip 25a of the pressing tool 25 is sufficiently polished to form a smooth mirror face, the convex portions of the substrate which is filled in the concave portions 26 to be formed can be formed 0.3 μm or less in a coarseness of the surface thereof. Next, as shown in FIG. 3, by press molding the glass substrate 27 using the mold 24 within an atmosphere increased to the transition temperature, the glass substrate 27 can be deformed easily into a desired shape. However, in this case, since fine shaping is required, it is necessary to prevent air bubbles from being mixed when the glass substrate is molded. Therefore, the press molding must be carried out within a vacuum atmosphere 28, e.g. at the vacuum degree of about 0.1 Torr.

The glass substrate 27 may be made of a low softening glass including either one of Ti, Na and B or all these elements and having a glass transition temperature of 550° C. to 600° C. Additionally, since it is difficult to shape the glass substrate 27 so as to have a prescribed thickness (e.g. 100–50 μm) when it is press molded, in the press molding, the glass substrate having a thickness of e.g. 0.5 mm or more may be adopted.

Figure 4:
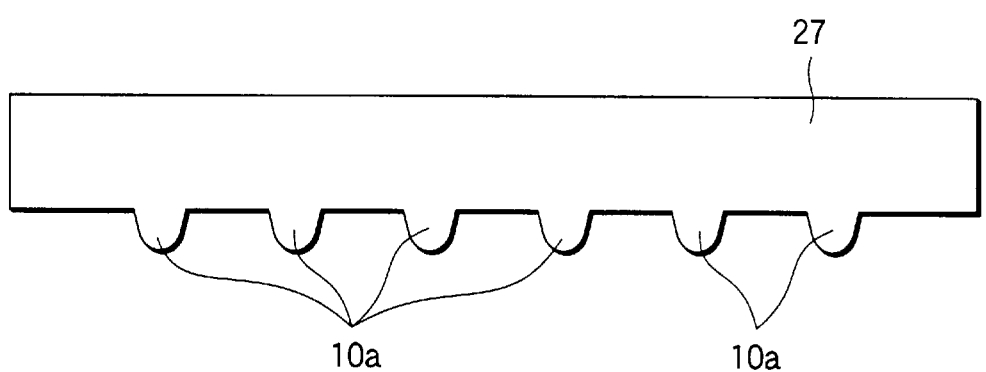
FIG. 4 is a view showing the method of manufacturing the probe card as shown in FIG. 1.

When the glass substrate 27 is press molded under the above condition, a part of the glass substrate 27 is filled in the concave portions 26 of the mold 24, and a plurality of convex portions 10a are formed in the glass substrate 27 as shown in FIG. 4. Incidentally, since the conditions and others when the glass substrate is press molded may be adopted in the embodiments described later, the explanation will be omitted at discretion.

Figure 5A:
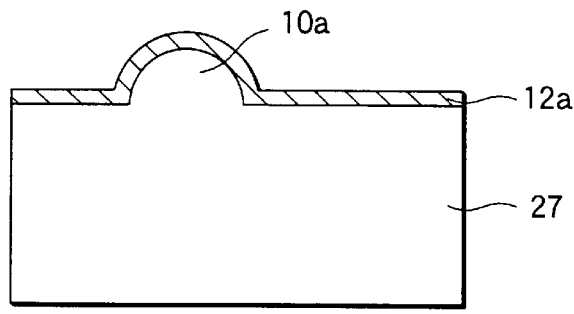
FIG. 5 is a view showing the method of manufacturing the probe card as shown in FIG. 1.

For example, by sputtering or plating, a contact film 12a having a thickness of several hundreds of Å is deposited on the surface of the glass substrate 27 where the convex portion 10a is formed (FIG. 5A). Next, for example, using a glass mask (not shown), only the concave portion 10a is exposed, and thereafter a tungsten film 13 having a thickness of 1 $\mu$m is deposited on only the convex portion 10a by e.g. CVD or PVD technique. Being formed by the CVD or PVD technique, the tungsten film 13 can be accurately formed to have surface coarseness depending on that of the convex portion 10a.

Figure 5B:
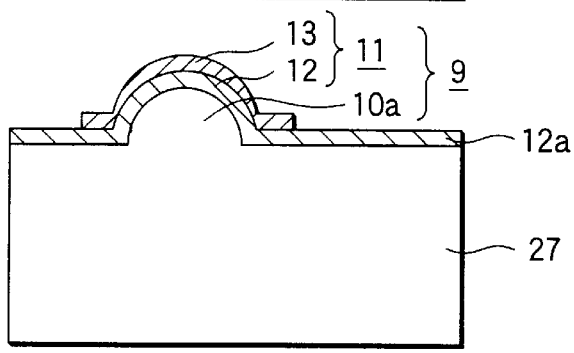
Figure 5C:
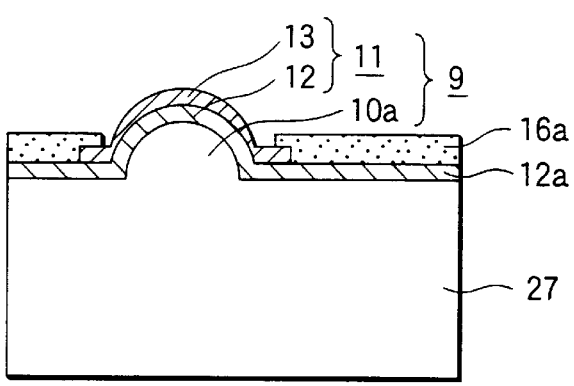

Thus, a conductive film 11 including the contact film 12 and tungsten film 13 is formed on the convex portion 10a, thereby forming a probe 9 including the convex portion 10a and the conductive film 11 (FIG. 5B). In this way, the probe 9 is formed to have surface coarseness of 0.3 $\mu$m or less. Next, a resist film (not shown) is patterned to cover only the convex portion 10a, and thereafter by e.g. plating, a metallic film 16 having a thickness of 10 $\mu$m is deposited on the contact film 12a (FIG. 5C).

Figure 5D:
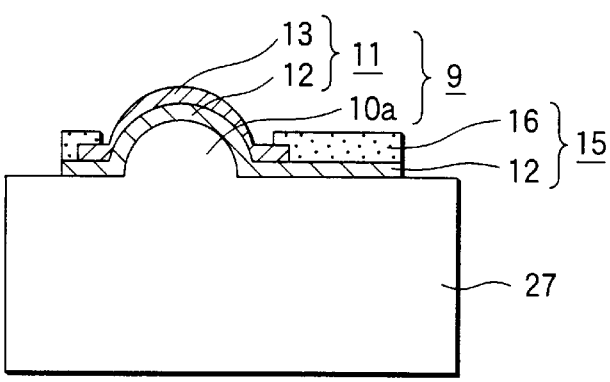
Figure 5E:
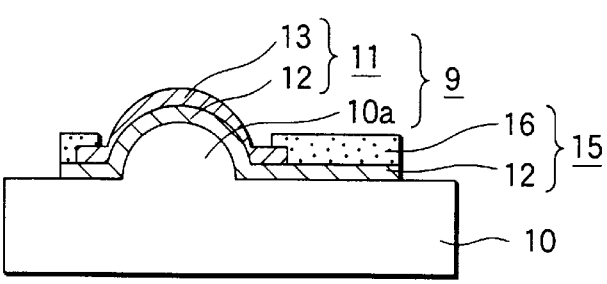
Figure 6A:
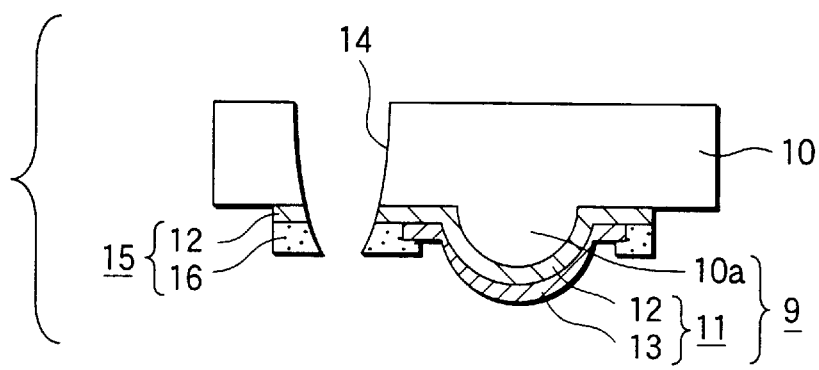
FIG. 6 is a view showing the method of manufacturing the probe card as shown in FIG. 1.

The contact film 12a and the metallic film 16a are patterned to form a wiring 15 including the contact film 12 and the metallic film 16 (FIG. 5D). The glass substrate 27 is polished to have a prescribed thickness, and a substrate 10 is formed (FIG. 5E). A coating of resist material which absorbs e.g. $CO_2$ gas laser is applied to the surface of the substrate 10 opposite to the surface thereof where the probe 9 is formed. The coating is irradiated with the $CO_2$ gas laser so that the patterned resist mask (not shown) is formed. Using this resist mask as a mask, the substrate 10 is etched by e.g. sandblast technique to form a through-hole 14 (FIG. 6A). Incidentally, the step of polishing the glass substrate and the step of forming the through-hole may be changed in their order. When the through-hole is made previously, wet etching may make the through-hole.

Figure 6B:
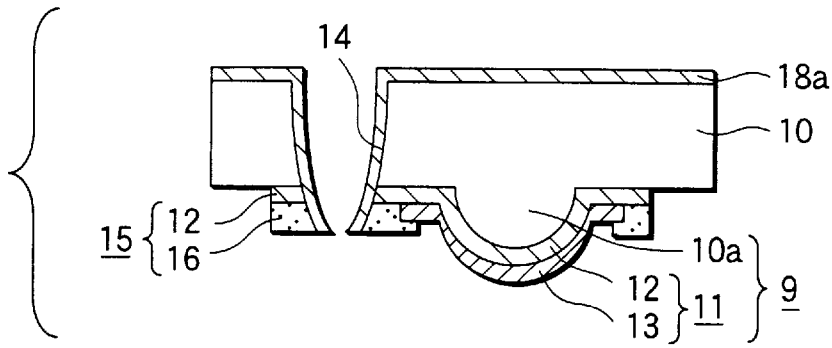
Figure 6C:
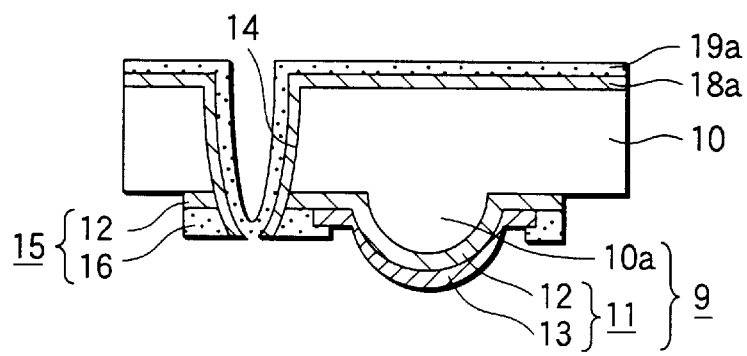
Figure 6D:
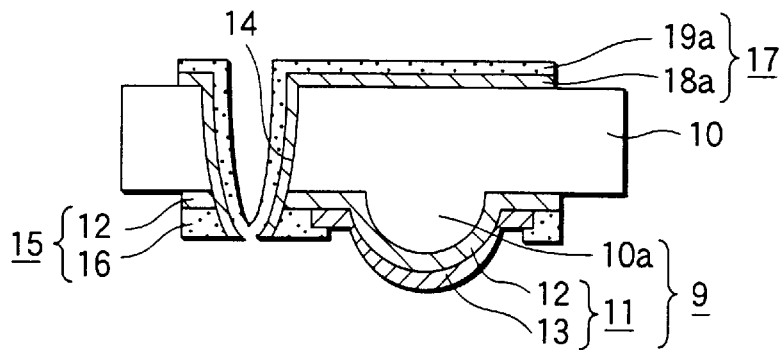
Figure 7A:
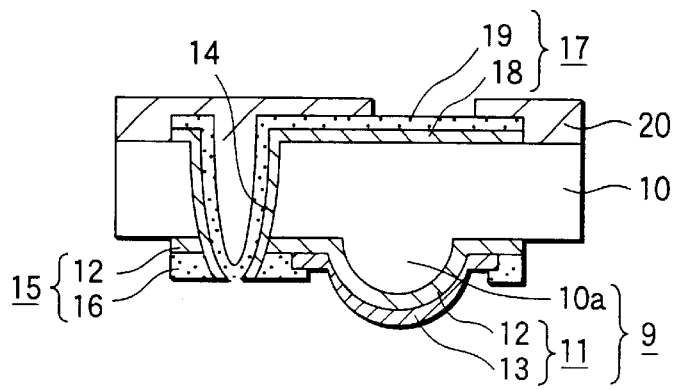
FIG. 7 is a view showing the method of manufacturing the probe card as shown in FIG. 1.

By e.g. sputtering or plating, a contact film 18a having a thickness of several hundreds of Å is deposited on the surface of the substrate 9 opposite to the surface thereof where the probe 9 is formed (FIG. 6B). By e.g. plating, a metallic film 19a having a thickness of 10 $\mu$m is formed on the contact film 18a (FIG. 6C). The contact film 18a and the metallic film 19a are patterned to form an underlying wiring 17 including the contact film 18 and the metallic film 19 (FIG. 6D). By e.g. spin coating, an insulting material having a thickness of 10 $\mu$m is coated to cover the underlying wiring 17 and baked. The insulating material thus baked is patterned by e.g. wet etching to form an insulating film 20 (FIG. 7A).

Figure 7B:
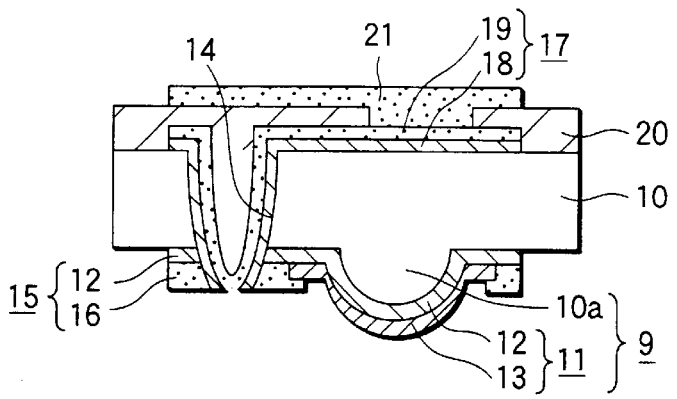
Figure 7C:
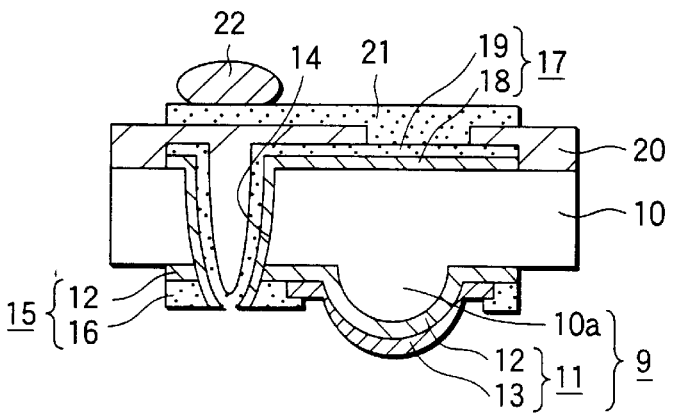
Figure 7D:
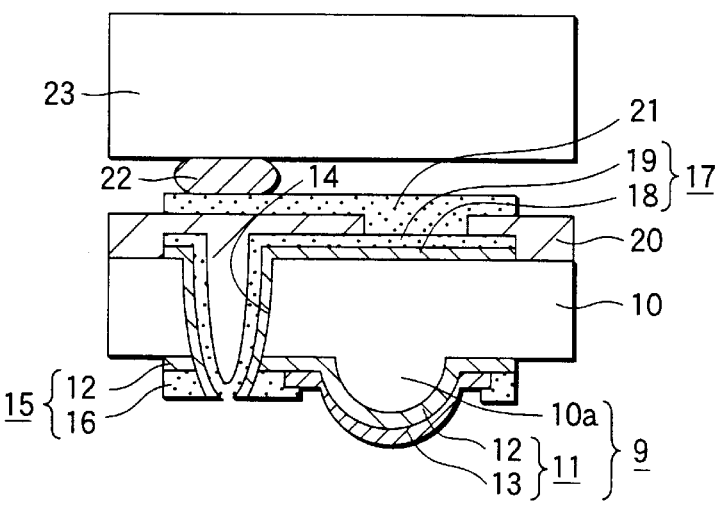

By e.g. plating, a metallic film having a thickness of 10 $\mu$m is deposited and patterned to form an overlying wiring 21 (FIG. 7B). An electrode 22 is formed on the overlying wiring 21 at the position where the though-hole 14 is made. With a wiring board 23 arranged on the electrode 22 (FIG. 7D) and with the probe 9 of the probe card 8 kept in contact with the bonding pad 7 of the semiconductor integrated circuit 6 as shown in FIG. 1, the semiconductor integrated circuit 6 is tested.

Figure 8:
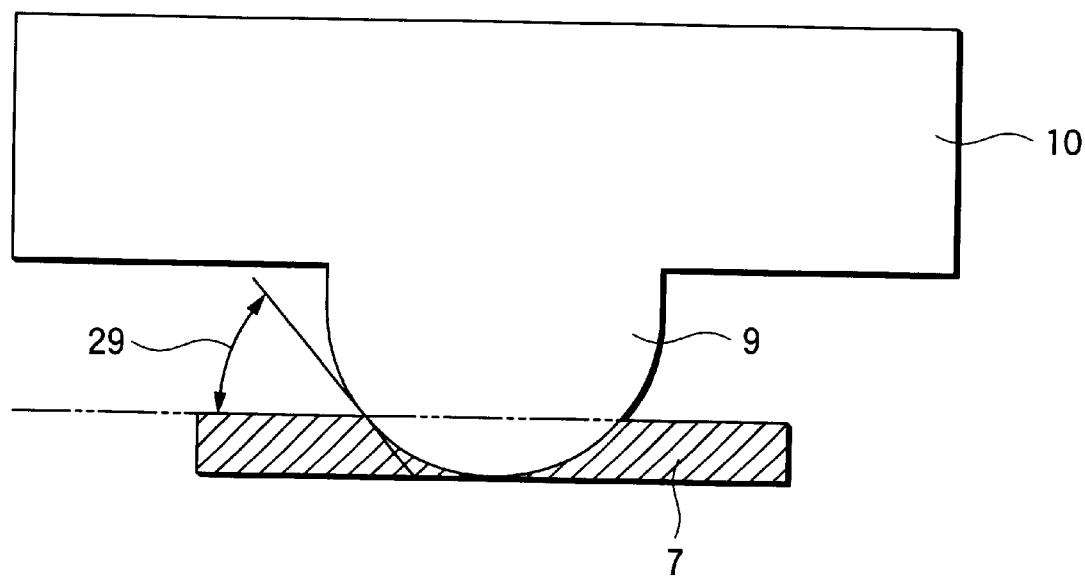
FIG. 8 is a view for explaining the shape of a probe in the probe card shown in FIG. 1.

In this case, as shown in FIG. 8, the bonding pad 7 and the probe 9 are formed so that when the probe 9 is brought into contact with the bonding pad 7, angle 29 formed by a surface of the bonding pad 7 at the contact position and the surface of the probe 9, is in a range of 15 degree to 35 degree. Thus, the probe 9 can be surely brought into electric contact with the bonding pad 7. When the angle 29 is smaller than 15 degree, it is difficult to break through an oxide film formed on the surface of the bonding pad 7 at the time of contact. Inversely, when the angle 29 is larger than 35 degree, the probe 9 breaks through the bonding pad 7 to damage the semiconductor integrated circuit 6 itself.

The surface coarseness of the probe 9 is as small as 0.3 $\mu$m or less so that the surface is sufficiently smooth. Therefore, it is possible to prevent conductive dust from being applied to the surface of the probe 9 and to prevent the contact between the probe 9 and the bonding pad 7 from being deteriorated. Incidentally, the conductive dust will be generated because the bonding pad 7 is shaved when the probe 9 is brought into contact with the bonding pad 7. Additionally, since the various embodiments which will be described below are the same relating to the angle 29 formed by the surface of the bonding pad 7 at the contact position and the surface of the probe 9, and the surface coarseness of the probe 9, the explanation thereof will be omitted at discretion.

In the probe card for testing the semiconductor integrated circuit according to the first embodiment thus constructed, the conductive film 11 is deposited on the surface of each of the plurality of convex portions 10a of the substrate 10 to form the probe 9. Thus, the convex portions 10a can be easily made and a thin film of the conductive film 11 has only to be formed. Consequently, this permits the probe 9 to be easily formed.

Further, since the uppermost film of the conductive film 11 of the probe 9 is formed of the tungsten film 13, the abrasion resistance of the contact between the probe 9 and the bonding pad 7 can be improved. Incidentally, in the first embodiment, although the electrode 22 is formed on the insulating film 20 at the position of the through-hole 14, it is needless to say that the electrode formed at other positions can also have the same effect as in the first embodiment.

Embodiment 2

Figure 9:
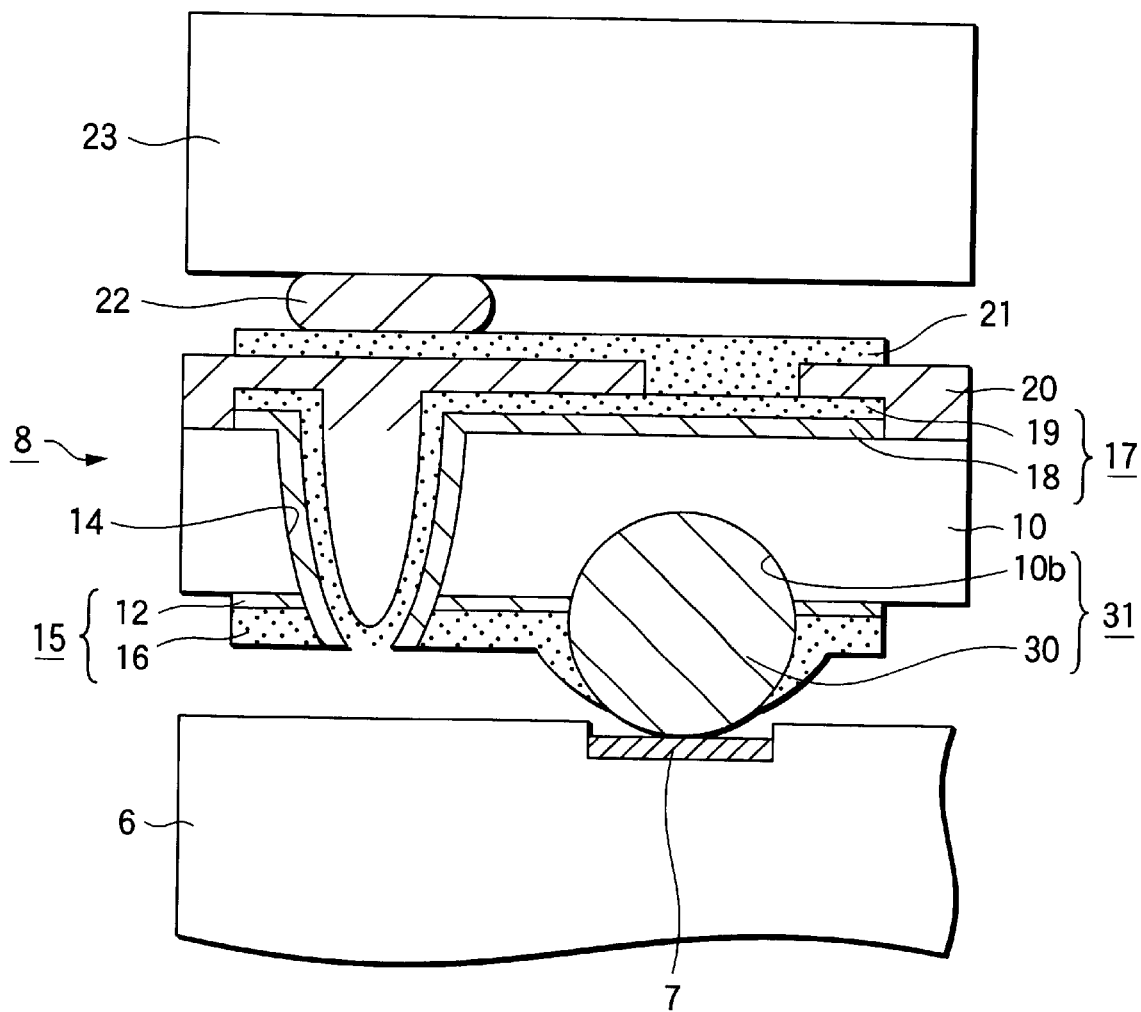
FIG. 9 is a sectional view of the probe card for testing a semiconductor integrated circuit according to the second embodiment of the invention.

FIG. 9 is a sectional view showing the structure of a probe card for testing a semiconductor integrated circuit according to the second embodiment of the invention. In FIG. 9, like reference numerals refer to like portions in the first embodiment and an explanation of the reference numerals are omitted. In FIG. 9, reference numeral 10b denotes a plurality of concave portions formed in the substrate 10. Reference numeral 30 denotes a conductive portion filled in each of the concave portions 10b. The upper end of the conductive portion 30 (which indicates a side not embedded in the substrate 10) protrudes from the flat surface of the substrate 10. The conductive portion 30 filled in the concave portion 10b constitutes the probe 31.

Figure 10:
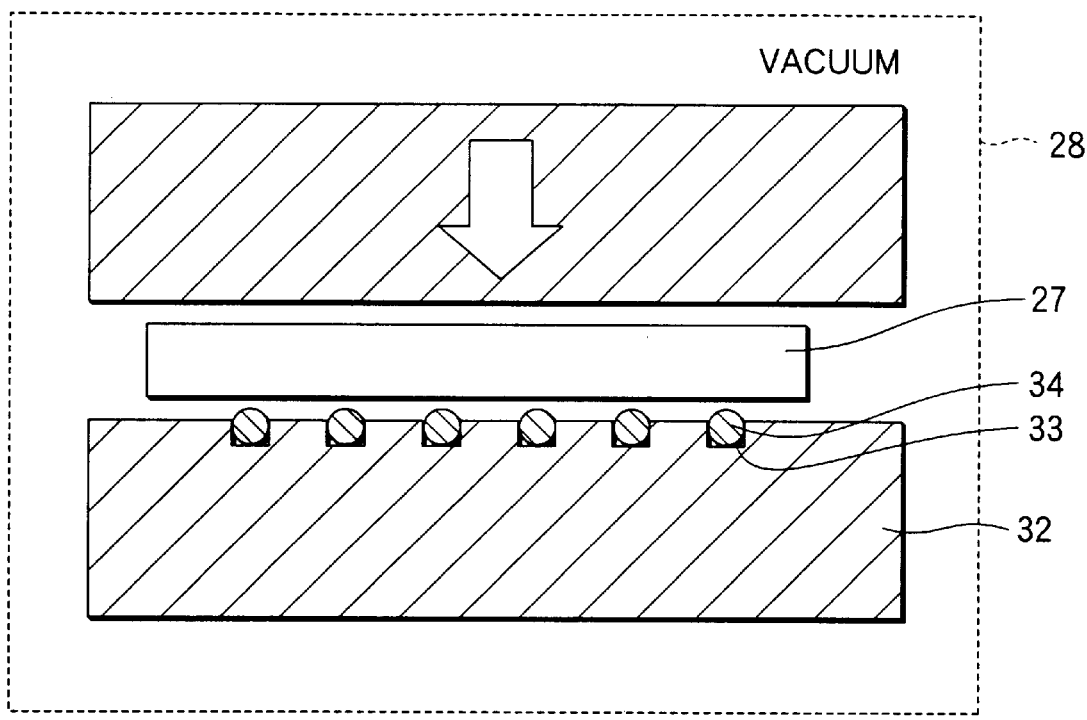
FIG. 10 is a view showing the method of manufacturing the probe card as shown in FIG. 9.

An explanation will be given of a method of manufacturing a probe card according to the second embodiment structured as described above. First, the case where a glass substrate is used as the substrate will be explained. As in the first embodiment, a pressing tool, which has a tip made of a material with higher hardness than a mold 32, is pressed onto the mold 32 to leave pressing trace, and a plurality of concave portions 33 is formed. As shown in FIG. 10, conductive members 34 are arranged in the concave portions 33, respectively. The conductive members 34 may be e.g. metallic balls having diameters of 30–60 µm. The glass substrate 27 is press molded in a vacuum atmosphere 28 increased to the transition temperature.

Figure 11:
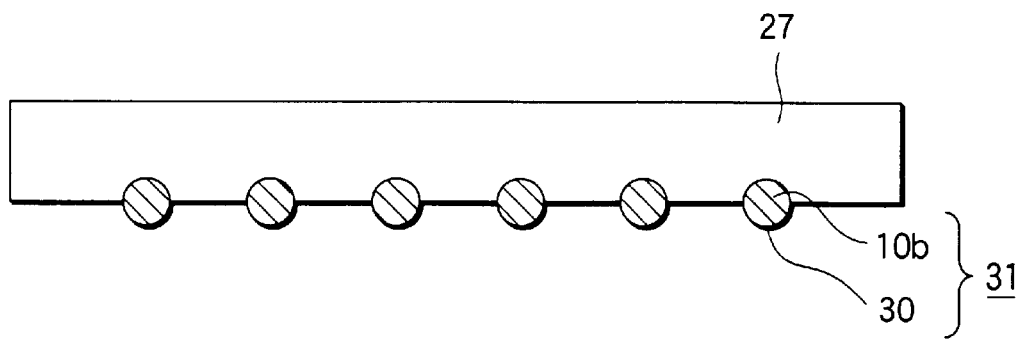
FIG. 11 is a view showing the method of manufacturing the probe card as shown in FIG. 9.

When the substrate 27 is press molded, a part of the glass substrate 27 is filled with the conductive member 34. Thus, as shown in FIG. 11, conductive portions 30 are embedded in the plurality of concave portions 10b of the glass substrate 27, respectively, thereby forming the probes 31. The process following after this step, which is the same as in the first embodiment, will not be explained here.

In the probe card for testing the semiconductor integrated circuit according to the second embodiment thus constructed, the conductive portion 30 is embedded in each of the concave portions 10b formed in the substrate 10, and the one end thereof is protruded from the upper surface of the substrate 10 to form the probe 31. Therefore, the probe 31 can be easily formed. In addition, since the entire protruding portion of the probe 31 is made of the conductive portion 30, the abrasion resistance of the contact between the probe 31 and a bonding pad can be improved more greatly than that of the first embodiment.

Embodiment 3

Figure 12:
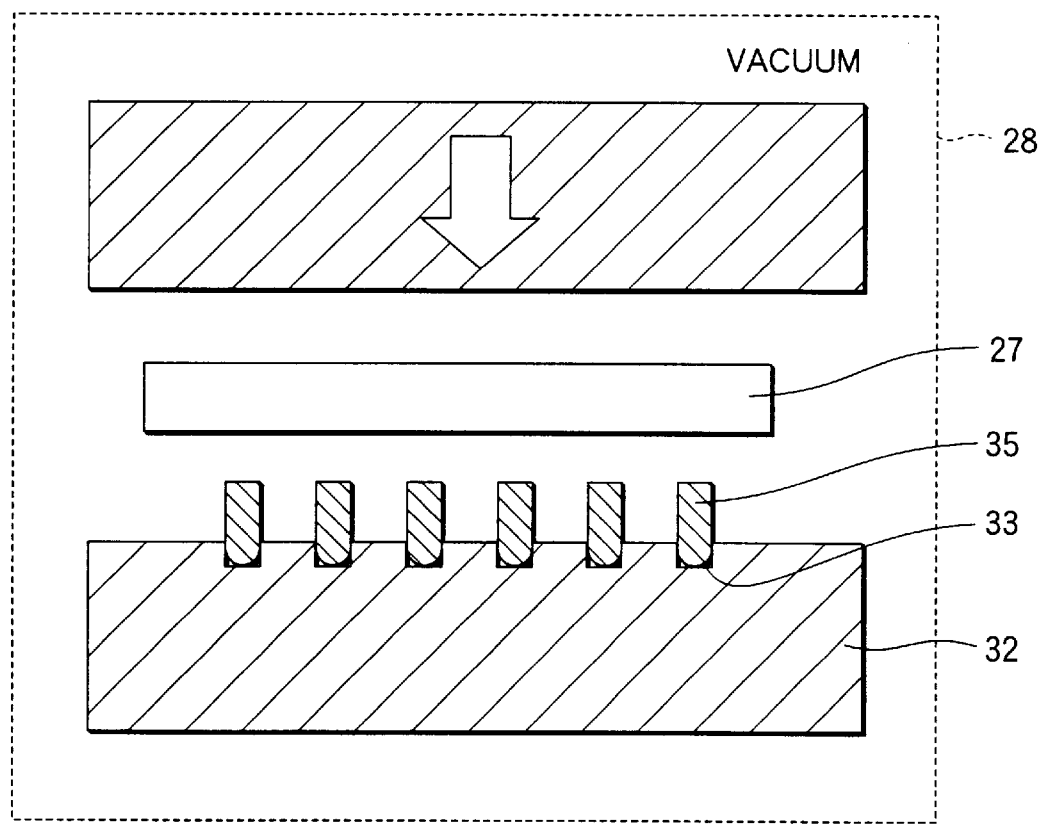
FIG. 12 is a sectional view of the probe card for testing a semiconductor integrated circuit according to the third embodiment of the invention.

FIGS. 12 and 13 are sectional views showing the structure of a probe card for testing a semiconductor integrated circuit according to the third embodiment of the invention. Referring to both figures, an explanation will be given of a method of manufacturing the probe card. First, as in the second embodiment described above, concave portions 33 are formed in a mold 32 and a conductive member 35 is arranged in each of the concave portions 33 as shown in FIG. 12.

The conductive member 35 is a metallic bar of nickel or tungsten with a semi-sphere or similar shape having a diameter of 35 µm or less at its tip (arranged in the concave portion 33). The conductive member 35 has a length not shorter than a prescribed thickness of the substrate used as a probe card plus a thickness of the portion which protrudes from the flat surface of the substrate and serves as a probe.

Figure 13A:
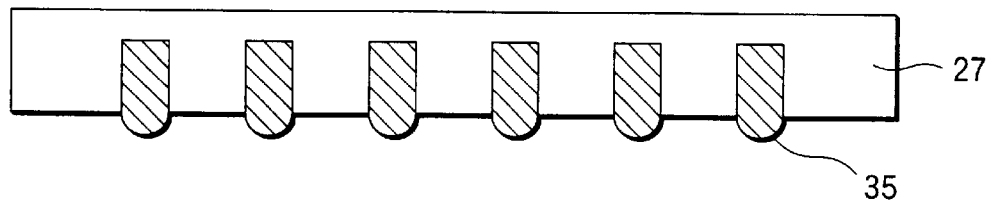
FIG. 13 is a view showing steps successive to the method of manufacturing the probe card shown in FIG. 12.
Figure 13B:
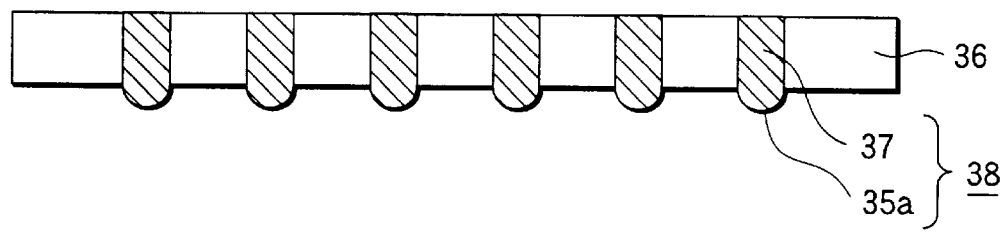
Figure 13C:
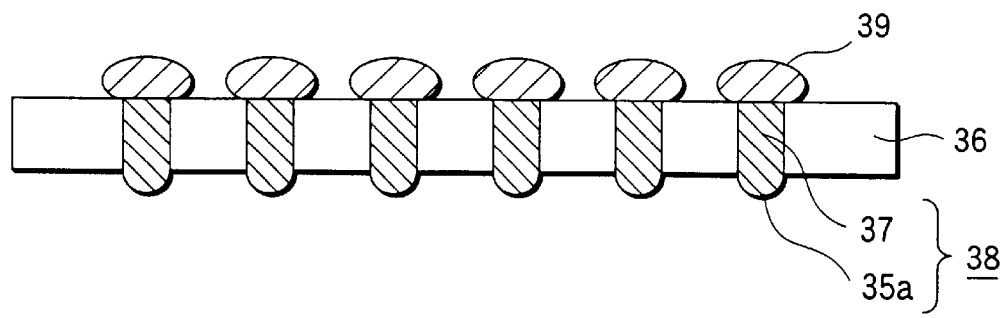

The glass substrate 27 is press molded in a vacuum atmosphere 28 increased to the transition temperature. When the glass substrate 27 is press molded in this way, as shown in FIG. 13A, each of parts of the glass substrate 27 is filled with a part of the conductive member 35. The glass substrate 27 is polished to a prescribed thickness to form a substrate 36. In this case, one end of the conductive member 35 protrudes from the flat surface of the substrate 36 by a prescribed length whereas the other end thereof is made flush with the surface of the substrate 36 by this polishing. Thus, a conductive portion 35a is embedded in each of through-holes 37 of the substrate 36 to form the probes 38 (FIG. 13B). An electrode 39, for example, made of a solder ball is formed on the other end of each of the conductive portions 35 (FIG. 13C).

In the probe card for testing the semiconductor integrated circuit according to the third embodiment thus constructed, the conductive portion 35a is embedded in each of the through-holes 37 formed in the substrate 36, and the one end thereof is protruded from the upper surface of the substrate 36 to form the probe 38. Therefore, the probe 38 can be easily formed. In addition, since the entire protruding portion of the probe 38 is made of the conductive portion 35a, as in the second embodiment, the abrasion resistance of the contact between the probe 38 and a bonding pad can be improved.

Further, as in the embodiments described above, the conductive portion 35a serves as the wiring between the surface of the substrate where the probe is formed and the surface thereof where the probe is not formed. Therefore, the steps of forming the through-holes and wirings between both surfaces of the substrate are not required, and thereby making it simpler to manufacture the probe card. Further, since the wiring distance is occupied by only the conductive portion 35a, the electric resistance of the probe card can be decreased.

In the third embodiment, although the concave portion of the mold is formed accurately, it may be formed by e.g. drilling the mold and the conductive member may be arranged therein. However, in this case, although the concave portion of the mold can be easily formed, unlike the method of using the pressuring tool, it cannot be formed accurately. Thus, the lengths of the conductive members embedded in the concave portion become different.

Therefore, after the conductive members are embedded in the substrate, the ends of the conductive members on the side of the substrate where the probes are formed are polished so that the lengths of the portions protruding from the flat surface of the substrate are uniform. Thereafter, the substrate and the conductive members are polished so that the surface of the substrate and the other ends of the conductive members on the side of the substrate opposite to the side where the probes are formed are flush with the surface of the substrate. In this way, the same structure of the probe card as that in the third embodiment can be realized.

Though, in the second and the third embodiment, the tip of the conductive member is formed in a semi-spherical shape, the shape of the tip is not limited to this. After the conductive member is embedded in the substrate, the tip of the conductive member may be formed in a desired shape. This can be realized by rounding the surface of one end of the conductive member protruding from the glass member through polishing or wet etching to form the surface shape of the probe according to the first embodiment.

When the surface of the probe is formed through wet etching, since the substrate made of glass serves as an etching mask, the step of coating resist and exposing is not required. In this case, the conductive members each with a thin oxide film formed previously on its surface are embedded, whereby the contact between the conductive portion and the glass can be improved. This contributes to prevent an etching solution from invading an interface between the substrate and the conductive portion and selectively etching a region of the interface. Thus, the tip shape of the conductive member can be formed accurately in a desired shape.

Embodiment 4

In each of the embodiments described above, the configuration of the probe card, which can make it simple and easy to manufacture the probes, is explained. A configuration described below intends to improve the reliability in testing a semiconductor integrated circuit. First, as illustrated in FIGS. 1 and 9 relative to the embodiments described above, the through-hole is formed to penetrate through the substrate at a different position from the position of each probe. The electrode for inputting/outputting an electric signal is formed at the position of the through-hole 14 on the surface of the substrate opposite to the surface thereof where the probe is formed As seen from the plan view of FIG. 14A showing a plan view of FIG. 1, the same relationship between each probe and the through-hole connected thereto in relative location is set for all the probes.

Figure 14A:
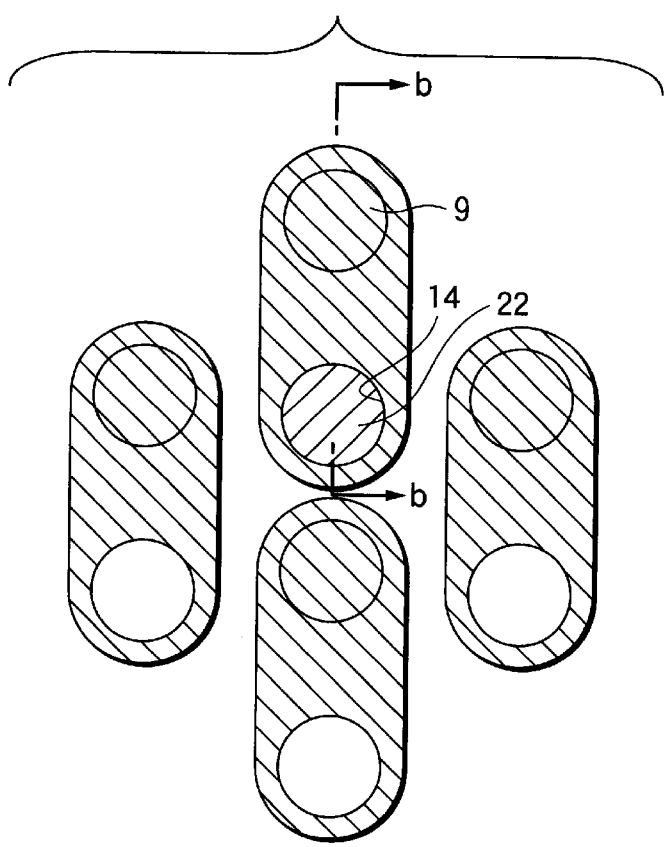
FIG. 14 is a plan view and a sectional view of the probe card for testing a semiconductor integrated circuit according to the fourth embodiment of the invention.
Figure 14B:
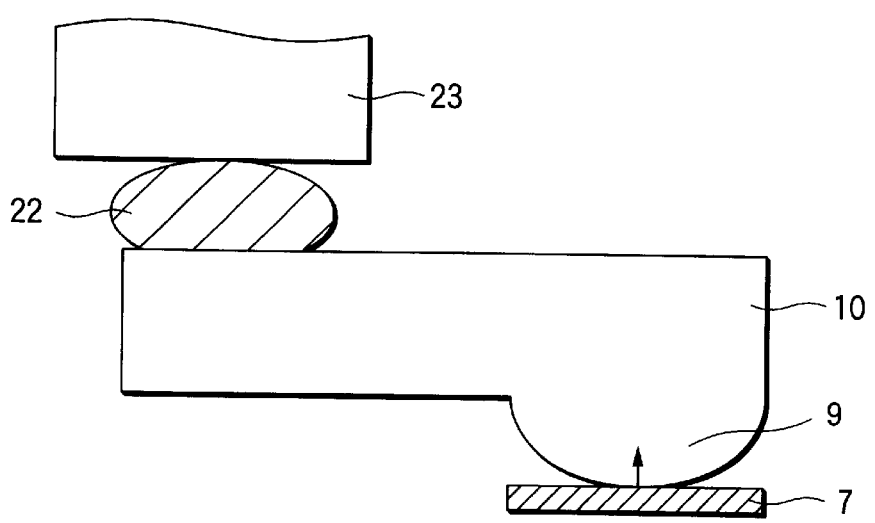

In this way, as seen from FIG. 14B showing a sectional view taken in line b—b in FIG. 14A, a prescribed distance can be assured between the probe 9 and the electrode 22. Therefore, in testing, with the probe card 8 fixed by the wiring board 23, when force is applied to the probe 9 from the side of the bonding pad 7, flexure corresponding to the distance between the probe 9 and the electrode 22 can be given. Thus, even when each probe 9 and bonding pad 7 have different heights, the difference can be absorbed by the flexure, and thereby permitting reliable testing carried out.

Actually, when the substrate (in a case of using a glass substrate) has a thickness of about 100 μm and whole formed pitch is formed in 100 μm, i.e. a distance between the probe and the electrode are formed at 100 μm, it is comfirmed that the difference in the height±about 2 μm can be absorbed as a whole.

Additionally, in the other embodiments described above also, as in the fourth embodiment, the difference in the height can be absorbed as long as there is the same relationship among the probe, the through-hole and the electrode in their locations.

Embodiment 5

In each of the embodiments described above, as seen from the plan view of e.g. FIG. 14(a), a sectional shape of the through-hole is formed in a circle. On the other hand, in this fifth embodiment, as seen from the plan view of the probe card in FIG. 15, an approximately U-shaped through-hole 39 having a sectional shape formed in an approximately U-shaped is formed so that a concave side thereof faces to the position of the probe 9.

In such a configuration, unlike the case that the sectional shape of the through-hole is formed in the circle, when the probe 9 and the bonding pad 7 are brought into contact with each other, an end of the approximately U-shape through-hole 39 can interrupt that movement of a certain probe affects on the adjacent probe. Therefore, even if there is a difference between the height of the probe and the height of the bonding pad, since movements of the probes 9 are not linked with one another, each probe can be brought into contact with the corresponding bonding pad, and thereby carrying out testing with great reliability.

Figure 15:
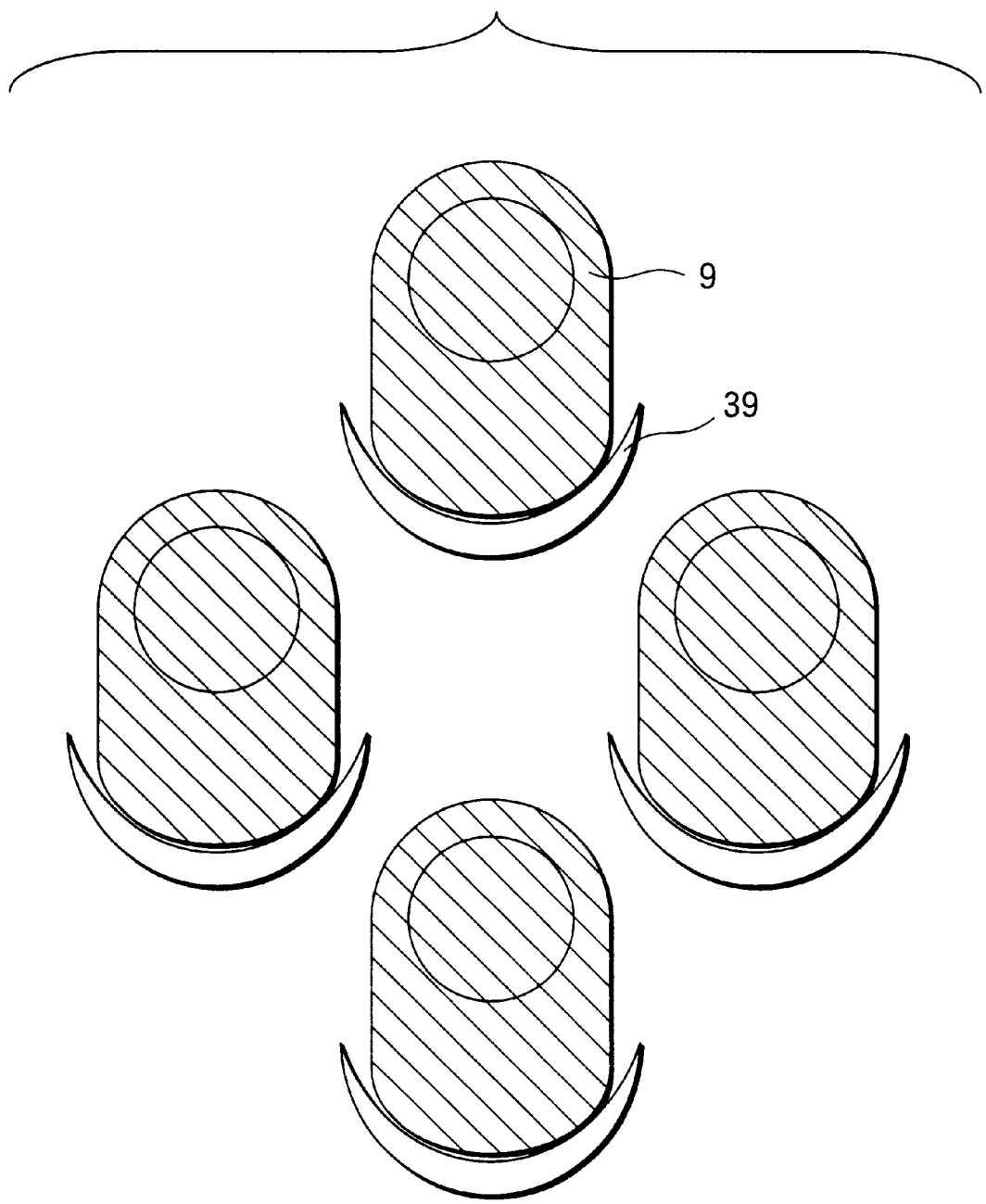
FIG. 15 is a plan view of the probe card for testing a semiconductor integrated circuit according to the fifth embodiment of the invention.

Incidentally, the approximately U-shape through-hole 39 should not be limited to a crescent shape as shown in FIG. 15. The approximately U-shaped through-hole 37 may be formed in various approximately U-shapes such as a V-shape, horseshoe-shaped, etc. so long as the shape does not deteriorate the strength of the substrate. The same effect as in the fifth embodiment can be obtained so long as the concave side of the through-hole faces the position of the probe.

Embodiment 6

Figure 16:
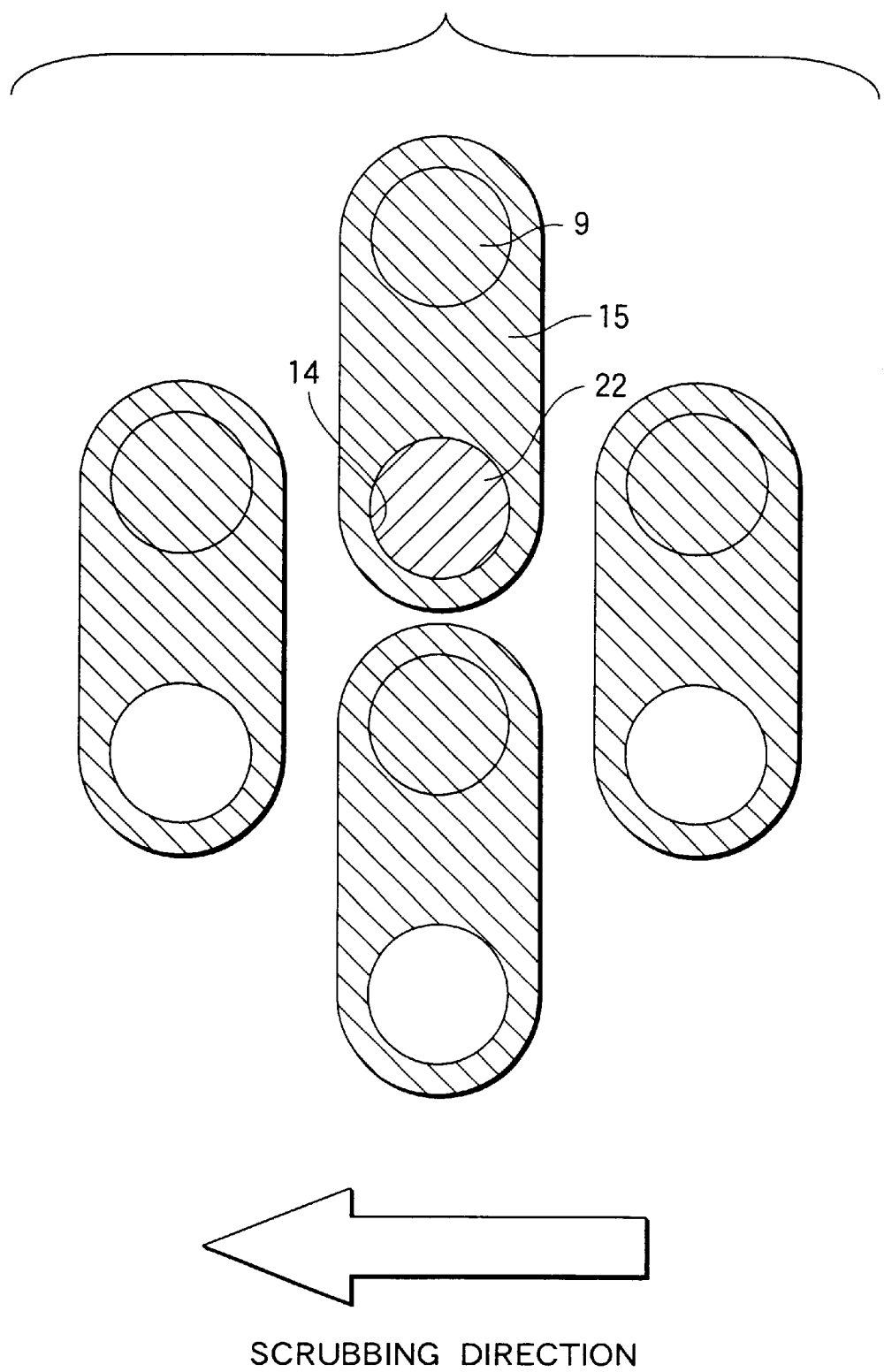
FIG. 16 is a plan view of the probe card for testing a semiconductor integrated circuit according to the sixth embodiment of the invention.

FIG. 16 is a plan view of the probe card for testing a semiconductor integrated circuit according to a sixth embodiment. Like reference numerals refer to like parts in each of the embodiments and an explanations thereof are omitted. A longitudinal direction of all the wirings 15 for electrically connecting the probes 9 to the corresponding through-holes 14 is formed perpendicular to a scrubbing direction when the probe card is brought into contact with the semiconductor integrated circuit.

Figure 17:
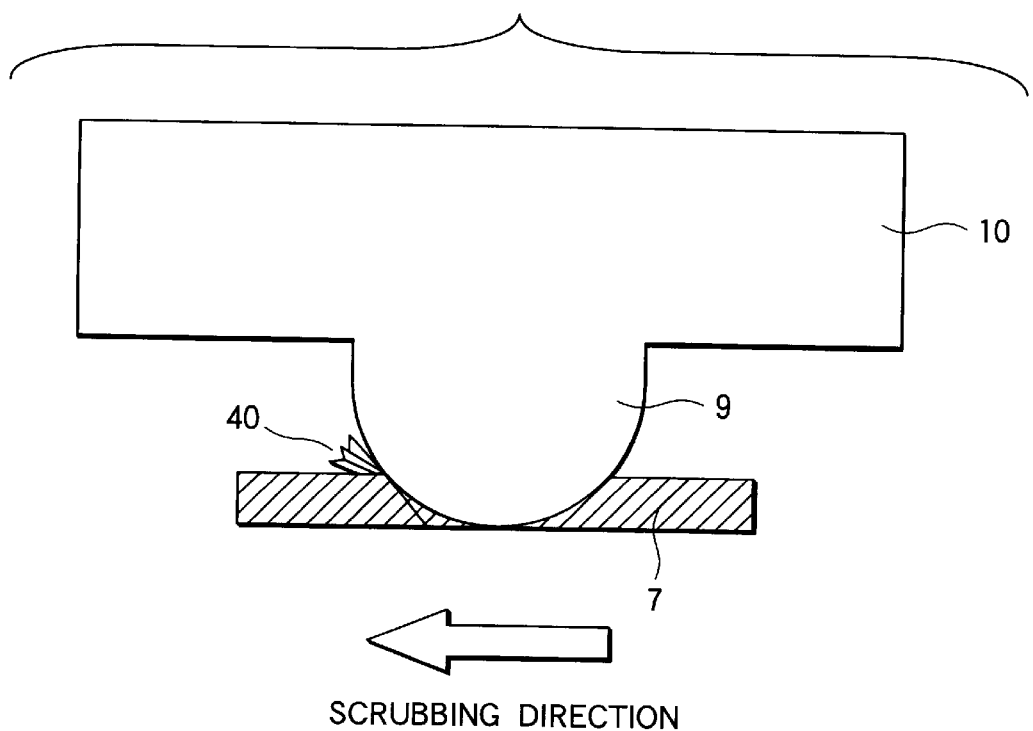
FIG. 17 is a view showing the scrubbing state of the probe card shown in FIG. 16.
Figure 18:
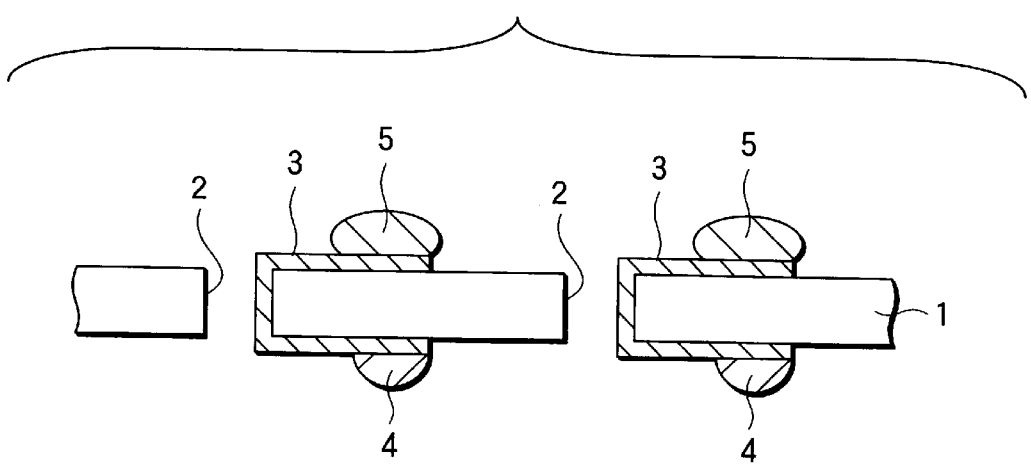
FIG. 18 is a plan view of the conventional probe card for testing a semiconductor integrated circuit.

In a testing of a semiconductor integrated circuit, the probe 9 and the bonding pad are connected to each other while they are moved to the scrubbing direction. This intends to obtain sure electric conduction therebetween while removing an oxide film formed on the upper surface of the bonding pad. In this case, as seen from FIG. 17, conductive dust 40 of the bonding pad 7 is generated at a side of the probe 9 in the scrubbing direction.

If the conductive dust 40 adheres to the wiring 15 of the probe card, both the conductive dust 40 and the wiring 15 are brought into contact with each other because both of them are made of metal. This generates poor electric contact, to deteriorate the reliability of the testing. However, in this sixth embodiment, since the longitudinal direction of the wiring 15 is formed in a direction different from a direction where the conductive dust 40 is generated, possibility of the conductive dust 40 adhering to the wiring 15 can be greatly decreased. Further, in a case that the conductive dust 40 adheres to the substrate 10 made of glass, since they have different natures, even if the conductive dust 40 adheres to the substrate 10, they are not contacted to each other but easily come off because they are made of different nature. Therefore, an adverse effect is not generated.

As understood from the description hitherto made, in accordance with the first aspect of the invention, a probe card for testing a semiconductor integrated circuit, having a plurality of probes adapted to input/output an electric signal for verifying an operation of the semiconductor integrated circuit to/from a plurality of positions on the semiconductor integrated circuit, the probe card comprises an insulating substrate defining a plurality of convex portions on a surface thereof, and conductive film depositing on the surface of the convex portions of the insulating substrate to form the plurality of probes. Therefore, the probe card for testing a semiconductor integrated circuit can be provided in which the probes can be easily formed.

In accordance with the second aspect of the invention, since in the first aspect of the invention, an uppermost layer of the conductive film is made of a tungsten film, the probe card for testing a semiconductor integrated circuit can be provided in which the resistance to the abrasion in testing the semiconductor integrated circuit can be improved.

In accordance with the third aspect of the invention, a probe card for testing a semiconductor integrated circuit, having a plurality of probes adapted to input/output an electric signal for verifying an operation of the semiconductor integrated circuit to/from a plurality of positions on the semiconductor integrated circuit, the probe card comprising an insulating substrate defining a plurality of concave portions, and a plurality of the conductive members embedded in the concave portions to protrude upper ends of the conductive members from an upper surface of the insulating substrate, thereby to form the plurality of the probes. Therefore, the probe card for testing a semiconductor integrated circuit can be provided in which the probes can be easily formed In accordance with the fourth aspect of the invention, a probe card for testing a semiconductor integrated circuit, having a plurality of probes adapted to input/output an electric signal to/from a plurality of positions of the semiconductor integrated circuit for verifying an operation of the semiconductor integrated circuit, the probe card comprising an insulating substrate defining a plurality of through-holes, and a plurality of conductive members embedded in the plurality of through-holes, wherein one end of the conducive members contacting with the semiconductor integrated circuit is protruded from an upper surface of the insulating substrate. Therefore, the probe card for testing a semiconductor integrated circuit can be provided in which the probes can be easily formed.

In accordance with the fifth aspect of the invention, in the fourth aspect of the invention, an electrode adapted to input/output an electric signal, the electrode are formed on a surface different from a side of the plurality of probes formed. Therefore, the probes can electrically contact with the though-holes only at the conductive members to simplify the configuration, thereby to provide the probe card with small electric resistance for testing a semiconductor integrated circuit can be provided.

In accordance with the sixth aspect of the invention, in a probe card for testing a semiconductor integrated circuit according to any one of the first to fifth aspects of the invention, the probes are formed to have a surface coarseness of 0.3 $\mu$m or less. Therefore, the probe card for testing a semiconductor integrated circuit can be provided in which dust generated when the probe and the semiconductor integrated circuit are brought into contact with each other is difficult to stick, and the electric contact can be obtained with great reliability.

In accordance with the seventh aspect of the invention, in a probe card for testing a semiconductor integrated circuit according to any one of the first to sixth aspect of the invention, the probes are formed to have an angle in a range of 15 to 35 degree between a contacted surface of the semiconductor integrated circuit and a surface of the probes when the probes are brought into contact with the semiconductor integrated circuit. Therefore, the probe card for testing a semiconductor integrated circuit can be provided in which sure contact can be established between the surface of the semiconductor integrated circuit and the surface of the probes.

In accordance with the eighth aspect of the invention, A probe card for testing a semiconductor integrated circuit comprises:

an insulating substrate;

a plurality of probes adapted to input/output an electric signal for verifying an operation of the semiconductor integrated circuit to/from a plurality of positions of the semiconductor integrated circuit, the probes formed on one surface of the insulating substrate;

through-holes formed to pass through the insulating substrate at positions which are different from positions of the probes so as to electrically connect the probes to side of the other surface of the insulating substrate which is different from one surface formed the probes, respectively;

electrodes each formed on each of the through-holes, adapted to input/output the electric signal, wherein each of relationships of relative positions between each of the probes and each of the through-holes connected to each of the probes are the same. Therefore, the probe card for testing a semiconductor integrated circuit can be provided in which sure contact can be established between the surface of the semiconductor integrated circuit and the surface of each of the probes even when a difference in the height of the probe occurs.

In accordance with the ninth aspect of the invention, a probe card for testing a semiconductor integrated circuit comprising:

an insulating substrate;

a plurality of probes adapted to input/output an electric signal for verifying an operation of the semiconductor integrated circuit to/from a plurality of positions of the semiconductor integrated circuit, the plurality of probes formed on one surface of the insulating substrate; and through-holes formed to pass through the insulating substrate so as to electrically connect the probes to side of the other surface of the insulating substrate with each other, which is different from one surface formed the probes, respectively, each of the through-holes having sectional shape in an approximately U-shaped, wherein each of concave sides of the sectional shape of the through-holes face to positions of the probes. Therefore, the probe card for testing a semiconductor integrated circuit pad can be provided in which ends of the approximately U-shape through-holes can interrupt that movement of a certain probe affects on the adjacent probe.

In accordance with the tenth aspect of the invention, a probe card for testing a semiconductor integrated circuit comprises:

an insulating substrate;

a plurality of probes adapted to input/output an electric signal for verifying an operation of the semiconductor integrated circuit to/from a plurality of positions of the semiconductor integrated circuit, the probes formed on one of surfaces of the insulating substrate;

through-holes formed to pass through the insulating substrate at positions which is different from positions of the probes so as to electrically connect probes to side of the other surface of the insulating substrate which is different from one surface formed the probes, respectively; and wirings formed on one surface of the insulating substrate where the probes are formed, to connect the probes to the through-holes with each other, respectively, wherein all longitudinal directions of the wirings are formed perpendicular to a direction of scrubbing the probe card. Therefore, the probe card for testing a semiconductor integrated circuit pad can be provided in which dust generated by contacting the probes with the semiconductor integrated circuit, the dust adhering to the wirings of the probes are can be reduced.

In accordance with the eleventh aspect of the invention, in a probe card for testing a semiconductor integrated circuit according to any one of the first to tenth aspects of the invention, the insulating substrate is made of a glass substrate. Therefore, the probe card for testing a semiconductor integrated circuit can be provided in which the probes can be more easily formed.

In accordance with the twelfth aspect of the invention, the insulating substrate of the probe card for testing a semiconductor integrated circuit according to the eleventh aspect of the invention, the insulating substrate is formed by press molding with the mold within a vacuum atmosphere increased to transition temperature of the glass substrate. Therefore, a method of manufacturing a probe card which can mold the probe card with great reliability can be provided.

In accordance with the thirteenth aspect of the invention, the mold has a plurality of desired concave portions formed by pressing a pressing tool having a higher hardness than the mold onto the mold. Therefore, a method of manufacturing a probe card can be provided which can form the concave portions of the mold with great accuracy and the protruding lengths of the probes uniform.

In accordance with the fourteenth aspect of the invention, in the method of manufacturing a probe card for testing a semiconductor integrated circuit according to claim 13, the plurality of concave potions of the mold are filled with the glass substrate to form a plurality of convex portions of the glass substrate, and a conductive film is formed on the convex potions by CVD technique or PVD technique, thereby forming a plurality of probes. Therefore, a method of manufacturing a probe card can be provided which can form the conductive film having small surface coarseness with great accuracy.

In accordance with claim the fifteenth aspect of the invention, the method of manufacturing the probe card according to the twelfth or thirteenth aspect of the invention, further comprises the steps of forming a mold having a plurality of concave portions, arranging conductive members in concave portions, respectively, and press molding the glass substrate by the mold to embed part of the conductive members in the glass substrate and to protrude the part of the conductive members from the glass substrate so as to form the probes. Therefore, the method of manufacturing a probe card can be provided which can easily form the probes.

In accordance with the sixteenth aspect of the invention, the method of manufacturing the probe card according to the fifteenth aspect of the invention, further comprises the steps of polishing a surface of the glass substrate which is different from a surface thereof where the probes are formed, to decrease the thickness of the glass substrate into a prescribed thickness, and forming through-holes at desired positions of the glass substrate. Therefore, the method of manufacturing a probe card can be provided which can easily form the desired glass substrate.

In accordance with the seventeenth aspect of the invention, the method of manufacturing the probe card according to claim 21, further comprises a step of pressing the glass substrate until each of the conductive members penetrates the glass substrate. Therefore, a method of manufacturing a probe card can be provided which can surely embed the conductive members in the glass substrate.

In accordance with the eighteenth aspect of the invention, the method of manufacturing the probe card according to claim 25, further comprises the steps of polishing one end of each of the conductive members so that lengths of the conducive members protruding from the glass substrate are uniform, to form the plurality of probes, and polishing the glass substrate and the conductive members so that the other end of each of the conductive members is flush with a surface of the glass substrate. Therefore, a method of manufacturing a probe card can be provided which can surely form the probes.

In accordance with the nineteenth aspect of the invention, the method of manufacturing the probe card according to any one of the sixteenth to eighteenth aspects of the invention, further comprises the step of rounding a surface of one end of each the conductive member protruding from the glass substrate by polishing or wet etching to form the probes, thereby forming the surface of the probe defined in claim 7. Therefore, a method of manufacturing a probe card can be provided which can form the surface shape of the probe surely.

What is claimed is:

1. A probe card for testing a semiconductor integrated circuit, having a plurality of probes adapted to input/output an electric signal for verifying an operation of the semiconductor integrated circuit to/from a plurality of positions on the semiconductor integrated circuit, the probe card comprising:

an insulating substrate of a glass material defining a plurality of convex portions integrally formed on a surface thereof, and conductive film deposited on the surface of the convex portions of the insulating substrate to form the plurality of probes.

2. The probe card according to claim 1, wherein an uppermost layer of the conductive film is made of tungsten film.

3. The probe card according to claim 1, wherein the probes are formed to have a surface coarseness of 0.3 $\mu$m or less.

4. The probe card according to claim 1, wherein the probes are formed to have an angle in a range of 15 to 35 degree between a contacted surface of the semiconductor integrated circuit and a surface of the probes when the probes are brought into contact with the semiconductor integrated circuit.

5. The probe card according to claim 1, further comprising a plurality of through-holes formed at different positions from positions of said convex portions.

6. The probe card according to claim 5, further comprising underlying wirings formed in each inner wall of the through-holes and on a surface of the substrate opposite to the surface where the convex portions are formed.

7. The probe card according to claim 6, further comprising wirings formed on the surface of the surface where the convex portions are formed to connect each conductive film to the underlying wirings.

8. The probe card according to claim 6, further comprising overlying wirings to electrically connect the underlying wirings to an electrode.

9. The probe card according to claim 7, further comprising overlying wirings to electrically connect the underlying wirings to an electrode.

10. The probe card according to claim 1, wherein the conductive film includes a contact layer and an uppermost layer.

11. The probe card according to claim 1, wherein the glass material is a low softening glass including at least one of Ti, Na and B and having a glass transition temperature of 550° C. to 600° C.

12. The probe card according to claim 1, wherein an angle formed by a surface at a contact position on the semiconductor integrated circuit and a surface of a probe is in a range of 15° to 35°.

* * * * *